United States Patent
Baba

(10) Patent No.: US 8,228,712 B2
(45) Date of Patent: Jul. 24, 2012

(54) NONVOLATILE SEMICONDUCTOR MEMORY DEVICE

(75) Inventor: Yasuyuki Baba, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 206 days.

(21) Appl. No.: 12/725,655

(22) Filed: Mar. 17, 2010

(65) Prior Publication Data
US 2011/0051493 A1 Mar. 3, 2011

(30) Foreign Application Priority Data
Aug. 31, 2009 (JP) ................. 2009-200136

(51) Int. Cl.
*G11C 11/00* (2006.01)
(52) U.S. Cl. ............... 365/148; 365/189.011; 365/207; 365/218
(58) Field of Classification Search .......... 365/148, 365/207, 278, 189.011, 218
See application file for complete search history.

(56) References Cited

U.S. PATENT DOCUMENTS

| | | | | |
|---|---|---|---|---|
| 6,862,213 | B2 * | 3/2005 | Hamaguchi | 365/158 |
| 7,245,543 | B2 * | 7/2007 | Oh et al. | 365/203 |
| 7,907,436 | B2 * | 3/2011 | Maejima et al. | 365/148 |
| 7,920,402 | B2 * | 4/2011 | Katoh et al. | 365/100 |

FOREIGN PATENT DOCUMENTS

| | | |
|---|---|---|
| JP | 2005-522045 | 7/2005 |
| JP | 2006-236556 | 9/2006 |
| JP | 2007-18615 | 1/2007 |
| JP | 2007-80311 | 3/2007 |
| JP | 2009-48679 | 3/2009 |
| JP | 2009-99199 | 5/2009 |
| JP | 2009-146479 | 7/2009 |
| WO | WO 2008/012871 A1 | 1/2008 |

OTHER PUBLICATIONS

Office Action issued Nov. 29, 2011 in Japanese patent Application No. 2009-200136 (with English translation).

* cited by examiner

*Primary Examiner* — Pho M Luu
(74) *Attorney, Agent, or Firm* — Oblon, Spivak, McClelland, Maier & Neustadt, L.L.P.

(57) ABSTRACT

A semiconductor memory device includes a memory cell array configured as an arrangement of memory cells each arranged between a first line and a second line and each including a variable resistor. A control circuit controls a voltage applied to the first line or the second line. A current limiting circuit limits a current flowing through the first line or the second line to a certain upper limit or lower. In a case where a writing operation or an erasing operation to a memory cell is implemented a plural number of times repeatedly, the current limiting circuit sets the upper limit in the writing operation or erasing operation of the p-th time higher than the upper limit in the writing operation or erasing operation of the q-th time (q<p).

16 Claims, 6 Drawing Sheets

NONVOLATILE SEMICONDUCTOR MEMORY DEVICE

CROSS REFERENCE TO RELATED APPLICATIONS

This application is based on and claims the benefit of priority from prior Japanese Patent Application No. 2009-200136, filed on Aug. 31, 2009, the entire contents of which are incorporated herein by reference.

BACKGROUND OF THE INVENTION

1. Field of the Invention

The present invention relates to a nonvolatile semiconductor memory device, more specifically to a nonvolatile semiconductor memory device configured as an arrangement of memory cells that are provided with a variable resistor and are operative to store data by changing the resistance of the variable resistor.

2. Description of the Related Art

In recent years, along with a rising level of integration in semiconductor devices, circuit patterns of transistors and the like which configure the semiconductor devices are being increasingly miniaturized. Required in this miniaturization of the patterns is not simply a thinning of line width but also an improvement in dimensional accuracy and positional accuracy of the patterns. This trend applies also to semiconductor memory devices.

Conventionally known and marketed semiconductor memory devices such as DRAM, SRAM, and flash memory each use a MOSFET as a memory cell. Consequently, there is required, accompanying the miniaturization of patterns, an improvement in dimensional accuracy at a rate exceeding a rate of the miniaturization. As a result, a large burden is placed also on the lithography technology for forming these patterns which is a factor of rise in product cost.

In recent years, resistance varying memory is attracting attention as a candidate to succeed these kinds of semiconductor memory devices utilizing a MOSFET as a memory cell (refer, for example, to Japanese Unexamined Patent Application Publication (Translation of PCT Application) No. 2005-522045). Such a resistance varying memory can employ a cross-point type cell structure in which a memory cell is formed at a cross point of a bit line and a word line that intersect with each other. This structure can be more easily miniaturized than a conventional memory cell structure and can also be configured as a vertically stacked structure. Therefore, this structure is advantageous in that it is easy to improve the level of integration of the memory cell array.

Write of data (setting operation) to a so-called unipolar-type resistance varying memory (in which a memory cell includes a unidirectional rectifying element) is implemented by applying a certain voltage for a short time to a variable resistor. As a result, the variable resistor changes from a high-resistance state to a low-resistance state. In contrast, erase of data (resetting operation) is implemented by applying for a long time to the variable resistor in the low-resistance state subsequent to the setting operation a certain voltage which is set lower than in the setting operation. As a result, the variable resistor changes from the low-resistance state to the high-resistance state.

In implementing such setting and resetting operations, it is important to appropriately control a cell current that flows through the variable resistor, not only from a perspective of reducing power consumption but also from a perspective of ensuring stable setting and resetting operations. If the cell current is excessively large, a short-circuiting current path (short path) might be formed in the variable resistor, which might spoil the memory cell function. Hence, it is desired that the control system be configured to be able to avoid such a situation as much as possible.

SUMMARY OF THE INVENTION

A semiconductor memory device according to one aspect of the present invention includes: a memory cell array configured as an arrangement of memory cells each arranged between a first line and a second line and each including a variable resistor; a control circuit configured to control a voltage applied to the first line or the second line; and a current limiting circuit configured to limit a current flowing through the first line or the second line to a certain upper limit or lower. The current limiting circuit is configured to, in a case where a writing operation or an erasing operation to the memory cell is implemented a plural number of times repeatedly, set the upper limit in the writing operation or erasing operation of a p-th time higher than the upper limit in the writing operation or erasing operation of a q-th time (q<p).

DETAILED DESCRIPTION OF THE EMBODIMENTS

Next, the embodiments of the present invention will be explained in detail with reference to the drawings.

[First Embodiment]

Figure 1:
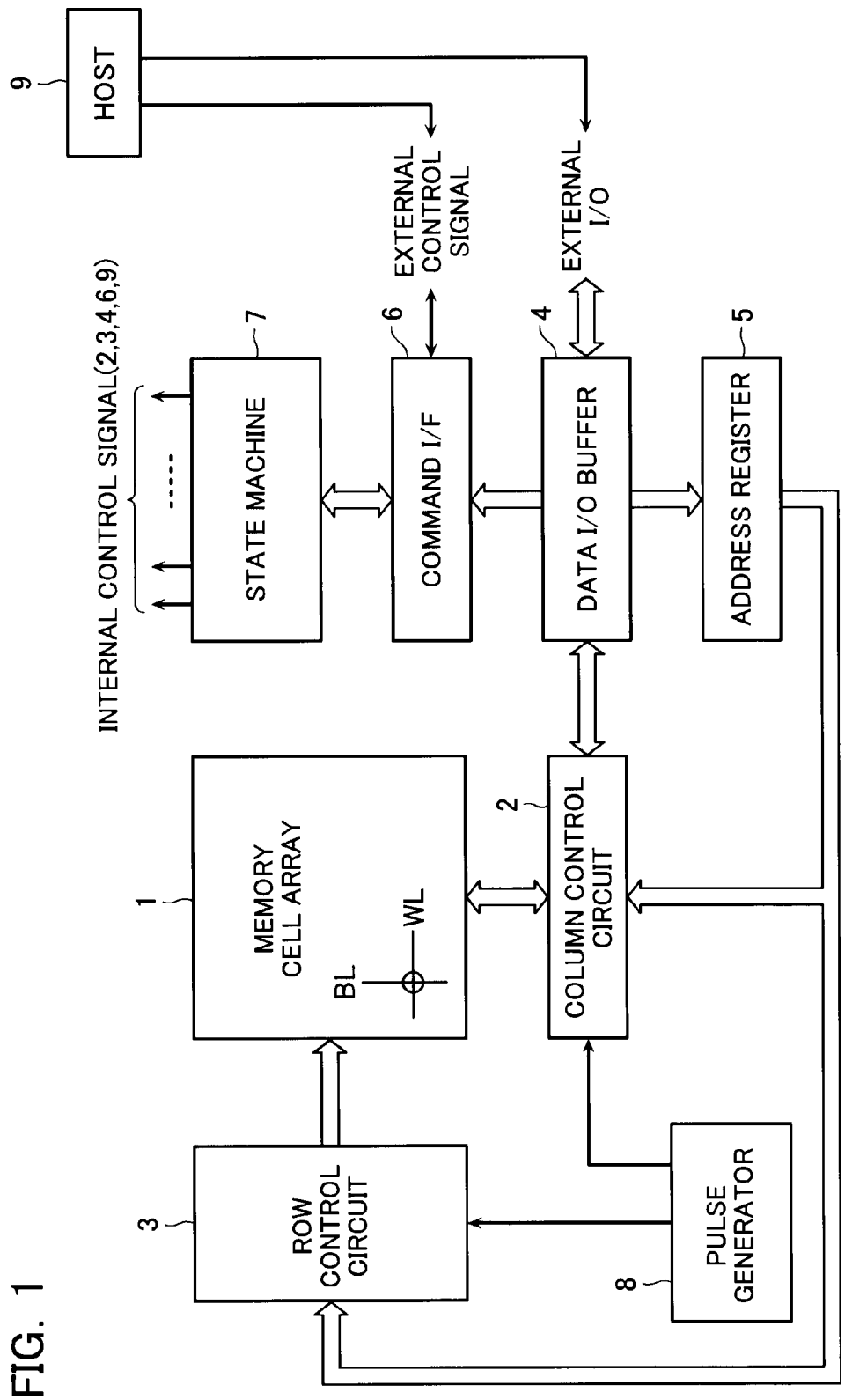
FIG. 1 is a block diagram of a nonvolatile semiconductor memory device according to an embodiment of the present invention.

FIG. 1 is a block diagram of a nonvolatile memory in accordance with a first embodiment of the present invention.

The nonvolatile memory comprises a memory cell array 1 of memory cells arranged in matrix, each memory cell including a later-described ReRAM (variable resistor).

A column control circuit 2 is provided at a position adjacent to the memory cell array 1 in the bit line BL direction. It controls the bit line BL in the memory cell array 1 to erase data from the memory cell, write data in the memory cell, and read data out of the memory cell. A row control circuit 3 is provided at a position adjacent to the memory cell array 1 in the word line WL direction. It selects the word line WL in the memory cell array 1 and applies voltages required to erase data from the memory cell, write data in the memory cell, and read data out of the memory cell.

A data I/O buffer 4 is connected to an external host 9 via an I/O line to receive write data, receive erase instructions, provide read data, and receive address data and command data. The data I/O buffer 4 sends received write data to the column control circuit 2 and receives read-out data from the column control circuit 2 and provides it to external. An address fed from external to the data I/O buffer 4 is sent via an address register 5 to the column control circuit 2 and the row control circuit 3.

A command fed from the host 9 to the data I/O buffer 4 is sent to a command interface 6. The command interface 6 receives an external control signal from the host 9 and decides whether the data fed to the data I/O buffer 4 is write data, a command or an address. If it is a command, then the command interface 6 transfers it as a received command signal to a state machine 7.

The state machine 7 manages the entire nonvolatile memory to receive commands from the host 9 via the command interface 6 to execute read, write, erase, and execute data I/O management. The external host 9 can also receive status information managed by the state machine 7 and decides the operation result. The status information is also utilized in control of write and erase.

The state machine 7 controls a pulse generator 8. Under this control, the pulse generator 8 is allowed to provide a pulse of any voltage at any timing.

The pulse formed herein can be transferred to any line selected by the column control circuit 2 and the row control circuit 3. Peripheral circuit elements other than the memory cell array 1 can be formed in a Si substrate immediately beneath the memory cell array 1 formed in a wiring layer. Thus, the chip area of the nonvolatile memory can be made almost equal to the area of the memory cell array 1.

Figure 2:
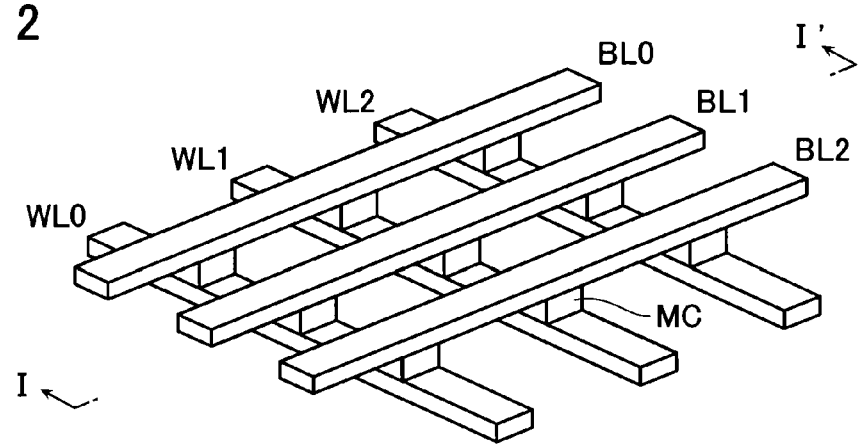
FIG. 2 is a perspective view of part of a memory array 1.
Figure 3:
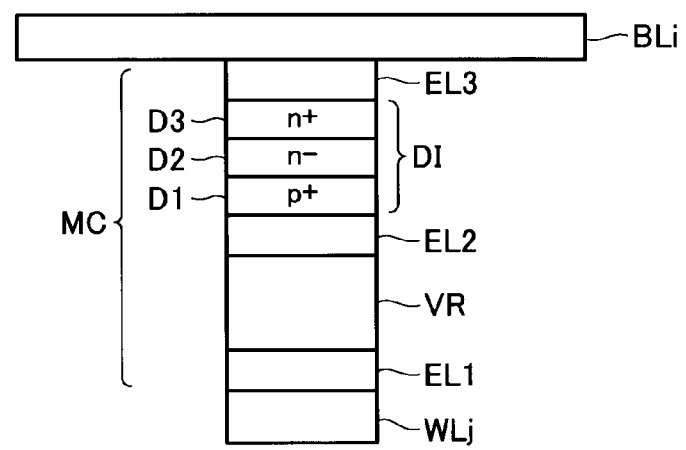
FIG. 3 is a cross-sectional view of one memory cell taken along a line I-I' and seen in the direction of the arrow in FIG. 2.

FIG. 2 is a perspective view of part of the memory cell array 1, and FIG. 3 is a cross-sectional view of one memory cell taken along a line I-I' and seen in the direction of the arrow in FIG. 2. There are plural first lines or word lines WL0-WL2 disposed in parallel, which cross plural second lines or bit lines BL0-BL2 disposed in parallel. A memory cell MC is arranged at each intersection of both lines so as to be sandwiched therebetween. Desirably, the first and second lines are composed of heat-resistive low-resistance material such as W, WSi, NiSi, CoSi.

The memory cell MC comprises a serial connection circuit of a variable resistor VR and a diode DI, as shown in FIG. 3. The diode DI is constituted by a PIN diode including a p+ type layer D1, an n− type layer D2, and an n+ type layer D3, as shown in FIG. 3. Here, the symbols "+" and "−" indicate the level of dopant concentration. The variable resistor VR is constituted by a thin film made of, for example, carbon (C). Arranged on an upper and a lower surface thereof are electrodes EL1, EL2 serving as a barrier metal layer and an adhesive layer.

Formed between the diode DI and the bit line BLi is an electrode EL3 serving as a barrier metal layer and an adhesive layer. The memory cell MC comprises a serial connection circuit of the variable resistor VR and the diode DI, as shown in FIG. 3.

Material of the electrodes EL1 to EL3 may include such as Pt, Au, Ag, TiAlN, SrRuO, Ru, RuN, Ir, Co, Ti, TiN, TaN, LaNiO, Al, PtIrOx, PtRhOx, Rh/TaAlN, and W. It is possible to insert a metal layer that would give a uniform orientation. It is also possible to separately insert a buffer layer, a barrier metal layer, an adhesive layer or the like.

Figure 4:
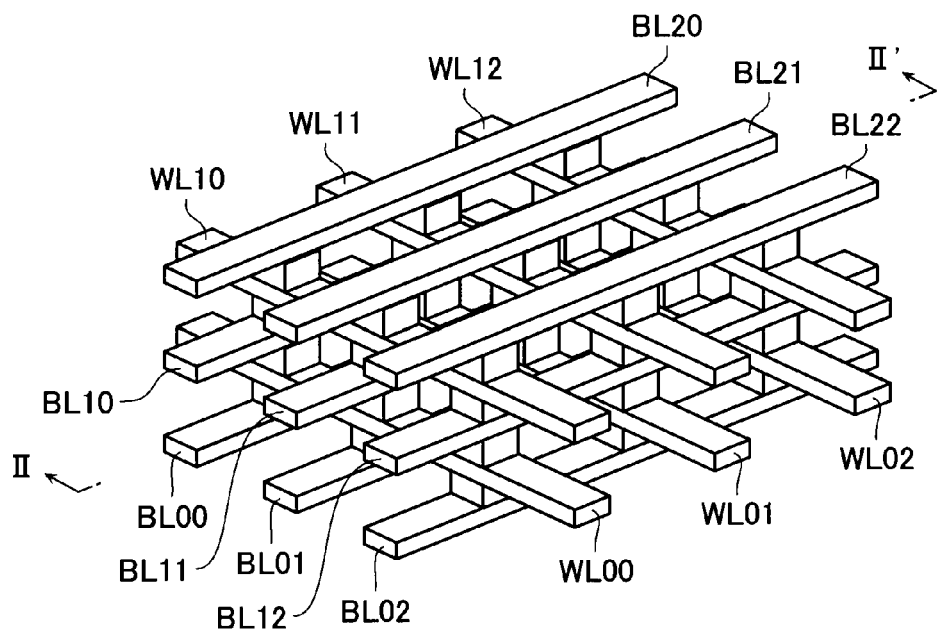
FIG. 4 shows another example of the configuration of the memory cell array 1.
Figure 5:
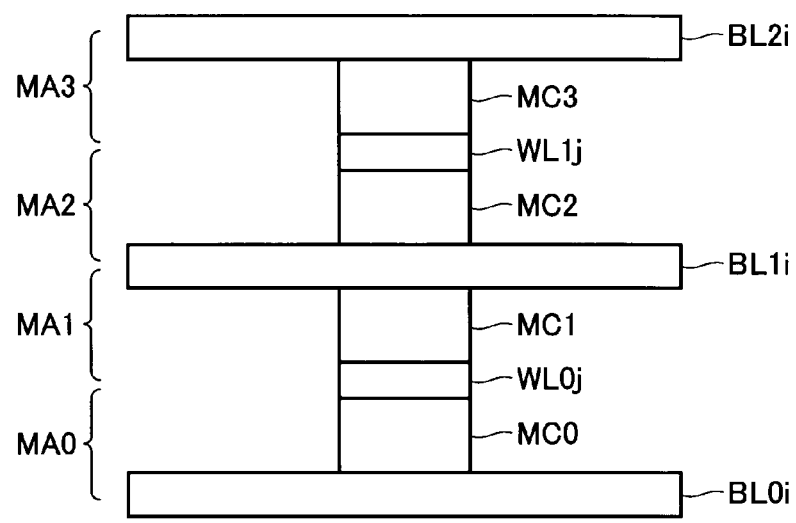
FIG. 5 shows another example of the configuration of the memory cell array 1.

Plural such memory structures described above may be stacked to form a three-dimensional structure as shown in FIG. 4. FIG. 5 is a cross-sectional view showing a II-II' section in FIG. 4. The shown example relates to a memory cell array of a 4-layer structure having cell array layers MA0~MA3. A word line WL0$j$ is shared by an upper and a lower memory cells MC0, MC1. A bit line BL1$i$ is shared by an upper and a lower memory cells MC1, MC2. A word line WL1$j$ is shared by an upper and a lower memory cells MC2, MC3.

In place of the line/cell/line/cell repetition, an interlayer insulator may be interposed as a line/cell/line/interlayer insulator/line/cell/line between cell array layers. The memory cell array 1 may be divided into MATs of several memory cell groups. The column control circuit 2 and the row control circuit 3 described above may be provided on a MAT-basis, a sector-basis, or a cell array layer MA-basis or shared by them. Alternatively, they may be shared by plural bit lines BL to reduce the area.

Figure 6:
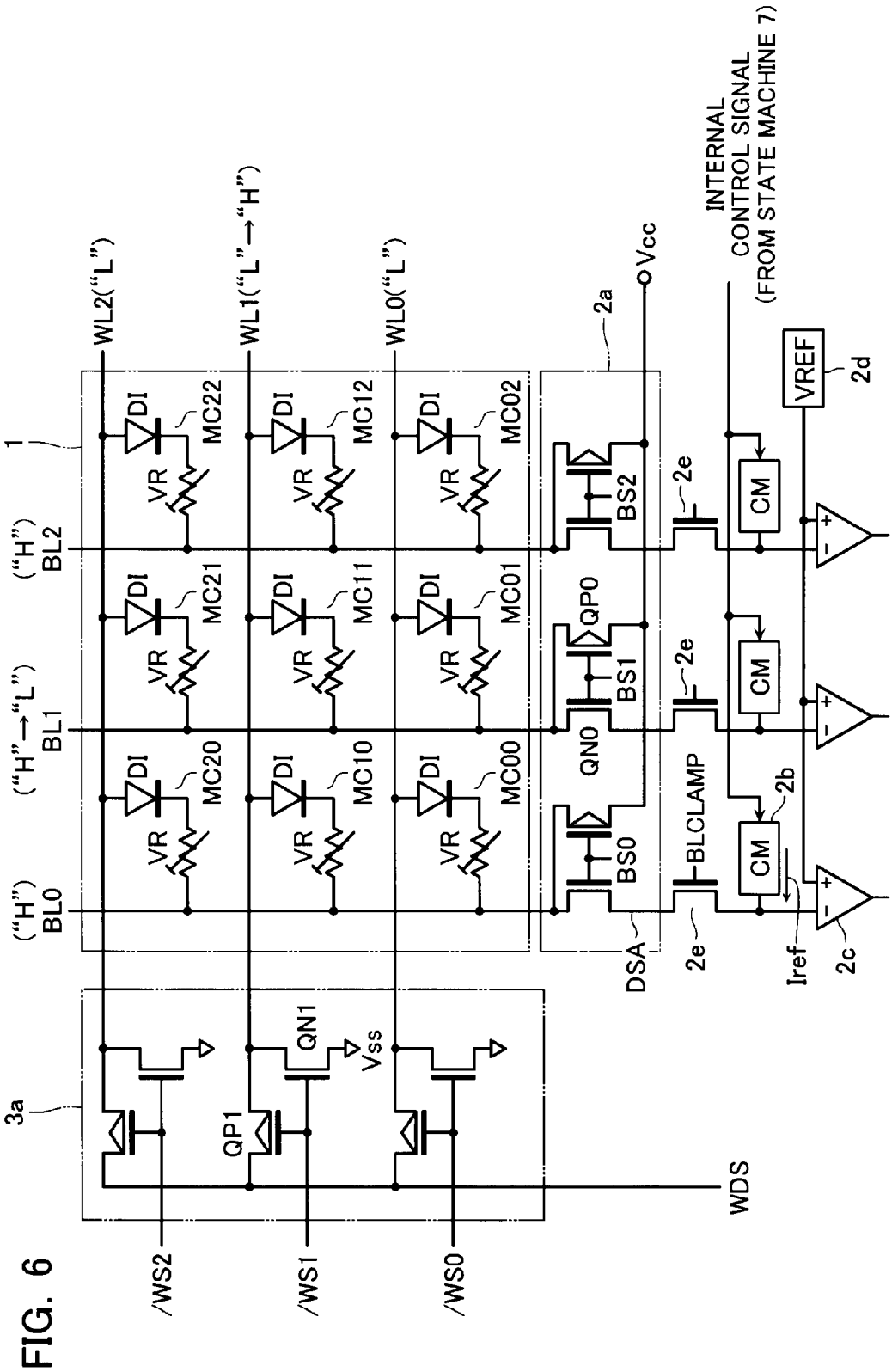
FIG. 6 is a circuit diagram of the memory cell array 1 and peripheral circuits thereof.

FIG. 6 is a circuit diagram of the memory cell array 1 and peripheral circuits thereof. For simplicity, the description advances on the assumption that the memory has a single-layered structure. In FIG. 6, the diode DI contained in the memory cell MC has an anode connected to the word line WL and a cathode connected to the bit line BL via the variable resistor VR. Each bit line BL has one end connected to a selection circuit 2$a$, which is part of the column control circuit 2. Each word line WL has one end connected to a selection circuit 3$a$, which is part of the row control circuit 3. In addition to the selection circuit 2$a$, the column control circuit 2 includes a current mirror circuit 2$b$, a sense amplifier circuit 2$c$, a reference voltage generating circuit 2$d$, and a clamp transistor 2$e$.

The clamp transistor 2$e$ comes into an electrically non-conductive state when the bit line BL is charged to a certain voltage. The sense amplifier circuit 2$c$ is configured to detect a difference between a voltage of a detection line DSA and a reference voltage generated by the reference voltage generating circuit 2$d$. The voltage of the detection line DSA changes based on a difference between a cell current flowing through the bit line BL and a reference current Iref supplied by the current mirror circuit 2$b$ in a data reading operation.

The selection circuit 2$a$ includes a selection PMOS transistor QP0 and a selection NMOS transistor QN0, provided at each bit line BL, of which gates and drains are commonly connected. The selection PMOS transistor QP0 has a source connected to a high potential source Vcc. The selection NMOS transistor QN0 has a source connected to the detection line DSA. The transistors QP0, QN0 have a common drain connected to the bit line BL, and a common gate supplied with a bit line selection signal BSi for selecting each bit line BL.

The current mirror circuit 2$b$ functions to generate a reference current Iref in a data reading operation, as described above. In addition, also in a setting operation and a resetting operation, the reference current Iref supplied by the current mirror circuit 2$b$ is supplied to the bit line BL through the detection line DSA. In this case, the current mirror circuit 2$b$ controls the upper limit Icomp of the reference current Iref to several levels in accordance with an internal control signal supplied by the state machine 7. In a case where a plural number of times of pulse applying operations are implemented for a setting operation or a resetting operation, the upper limit Icomp is set to a higher value as the count of the number of times increases. That is, the upper limit Icomp of the reference current Iref in a p-th pulse applying operation for a setting operation or a resetting operation is set to a higher value than the upper limit Icomp in a q-th pulse applying operation (where q<p). By setting the upper limit in this manner, it is possible to implement a setting or resetting operation stably and to reduce power consumption by suppressing the current flowing through the memory cell.

The selection circuit 3a includes a selection PMOS transistor QP1 and a selection NMOS transistor QN1, provided at each word line WL, of which gates and drains are commonly connected. The selection PMOS transistor QP1 has a source connected to a word line side drive sense line WDS, which is used to apply a write pulse and supply a detection current at a time of data read. The selection NMOS transistor QN1 has a source connected to a low potential source Vss. The transistors QP1, QN1 have a common drain connected to the word line WL and a common gate supplied with a word line selection signal /WSi for selecting each word line WL.

The memory cell array 1 may be configured to make a current flow from a bit line BL to a word line WL by reversing the polarity of the diode SD from the polarity thereof in the circuit shown in FIG. 6 (i.e., by connecting the diode SD such that a direction from a bit line BL to a word line WL becomes the forward direction).

Next an operation of the column control circuit 2 for implementing a resetting operation will be explained with reference to FIG. 7. In implementing a resetting operation, in an initial pulse applying operation after the resetting operation is started, the reference current Iref is set to an upper limit Icomp=m [A]. If the sense amplifier circuit 2c senses that the resistance of the memory cell has changed to a high resistance when, for example, n number of times of operations of applying a resetting pulse voltage have been implemented at this upper limit Icomp, the resetting operation is terminated at this point. If the sense amplifier circuit 2c senses that the resetting operation has not been completed by the n number of times of operations of applying a resetting pulse voltage at the upper limit Icomp=m [A], the state machine 7 instructs the current mirror circuit 2b to raise the upper limit Icomp of the reference current Iref for the resetting operation by l [A]. That is, the reference current Iref becomes Icomp=m+l [A]. n number of times of resetting operations are implemented again at this stepped-up upper limit Icomp=m+l.

Figure 7:
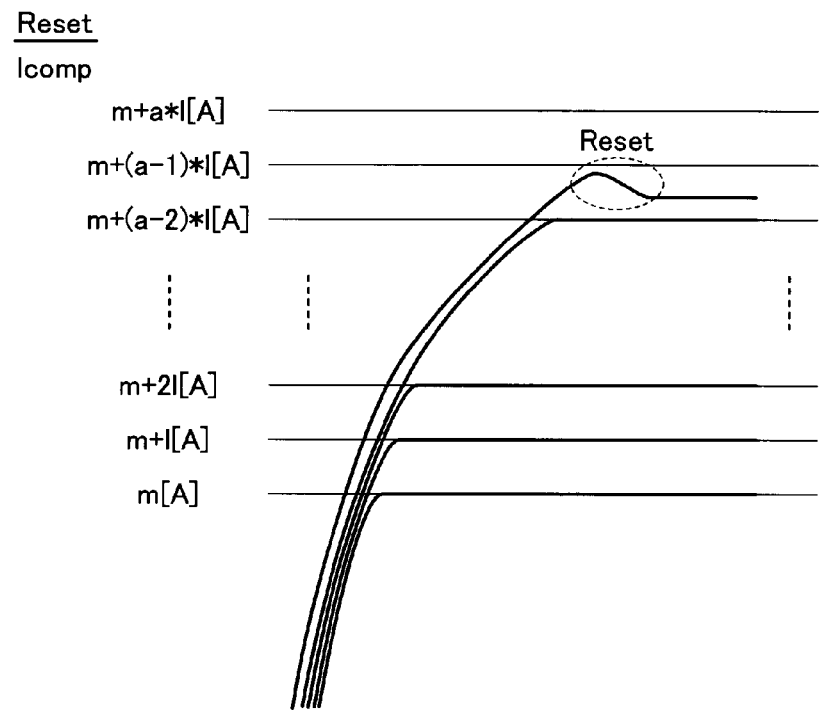
FIG. 7 explains a resetting operation according to a first embodiment of the present invention.

Subsequently, similar operations are repeated, and when a reduction of the current flowing through the memory cell MC is detected as shown in FIG. 7, a determination is made that the resetting operation has been completed, and the voltage applying operation for resetting is stopped.

As explained above, the present embodiment employs a scheme of gradually stepping up the upper limit of the reference current Iref supplied by the current mirror circuit 2b during a resetting operation, thereby gradually raising the upper limit of the cell current during the resetting operation. This operation enables current consumption to be lower than when a large resetting cell current is supplied from the very beginning of a resetting operation, and reduces the possibility that a short-circuiting current path is gradually formed in the variable resistor in the memory cell due to an excessive current to spoil the function as the memory cell.

Next, an operation of the column control circuit 2 for implementing a setting operation will be explained with reference to FIG. 8. In implementing a setting operation, in an initial pulse applying operation when the setting operation is started, the reference current Iref is set to an upper limit Icomp=m' [A]. If the sense amplifier circuit 2c senses that the resistance of the memory cell has changed to a low resistance when, for example, n number of times of operations of applying a setting pulse voltage have been implemented at this upper limit Icomp, the setting operation is terminated at this point. If the sense amplifier circuit 2c senses that the setting operation has not been completed by the n number of times of operation of applying a setting voltage at the upper limit Icomp=m' [A], the state machine 7 instructs the current mirror circuit 2b to raise the upper limit Icomp of the reference current Iref by l' [A]. That is, the reference current Iref becomes m'+l' [A]. n number of times of setting operations are implemented again at this stepped-up upper limit Icomp=m'+l'.

Figure 8:
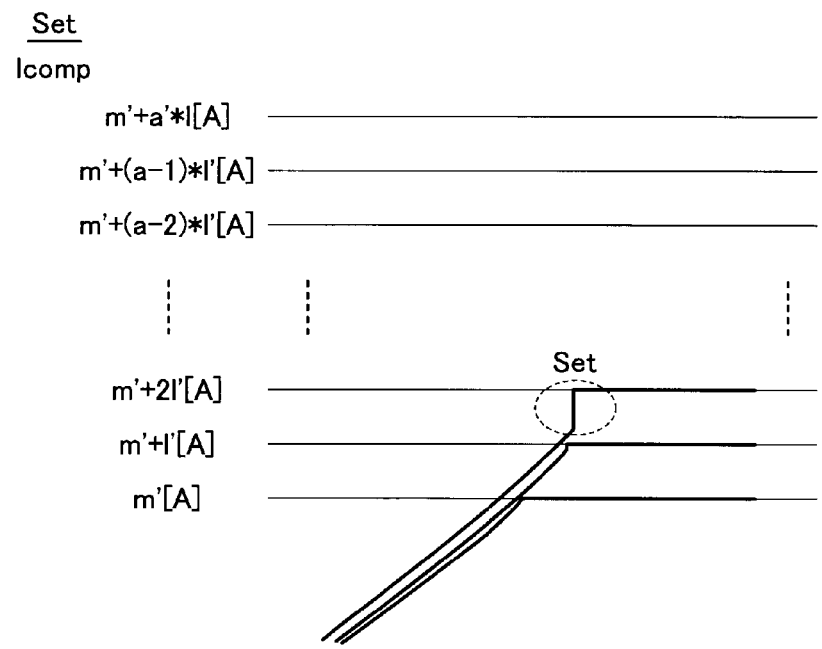
FIG. 8 explains a setting operation according to a first embodiment of the present invention.

Subsequently, similar operations are repeated, and when a sharp increase of the current flowing through the memory cell MC is detected as shown in FIG. 8, a determination is made that the setting operation has been completed, and the voltage applying operation for setting is stopped.

As described above, the present embodiment employs a scheme of gradually stepping up the upper limit of the reference current Iref supplied by the current mirror circuit 2b during a setting operation, thereby gradually raising the upper limit of the cell current during the setting operation. This operation enables current consumption to be lower than when a large setting cell current is supplied from the very beginning of a setting operation, and reduces the possibility that a short-circuiting current path is gradually formed in the variable resistor in the memory cell due to an excessive current to spoil the function as the memory cell.

[Second Embodiment]

Figure 9:
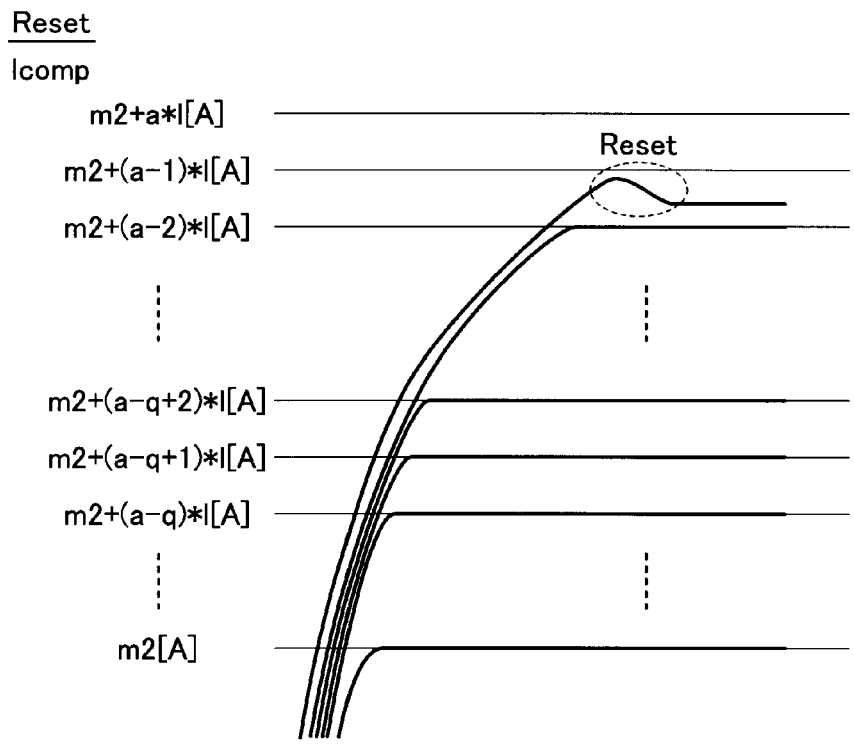
FIG. 9 explains a resetting operation according to a second embodiment of the present invention.

Next, the second embodiment of the present invention will be explained. The entire configuration of the semiconductor memory device according to the second embodiment is generally the same as that of the first embodiment. However, as shown in FIG. 9, the upper limit Icomp of the reference current Iref supplied by the current mirror circuit 2b at first when a resetting operation is started is set to a value m2 lower than the lowest current value at which a resetting operation can be effected, and n number of times of pulse applying operations are implemented at this upper limit Icomp=m2. After this, pulse applying operations are implemented by gradually raising the upper limit Icomp, similarly to the first embodiment.

The resetting operation is not effected by a pulse applying operation at the upper limit Icomp=m2 or a slightly higher upper limit Icomp. However, implementing this operation stabilizes the characteristic of the variable resistor of the memory cell and can make unevenness of the characteristic among the memory cells smaller.

Figure 10:
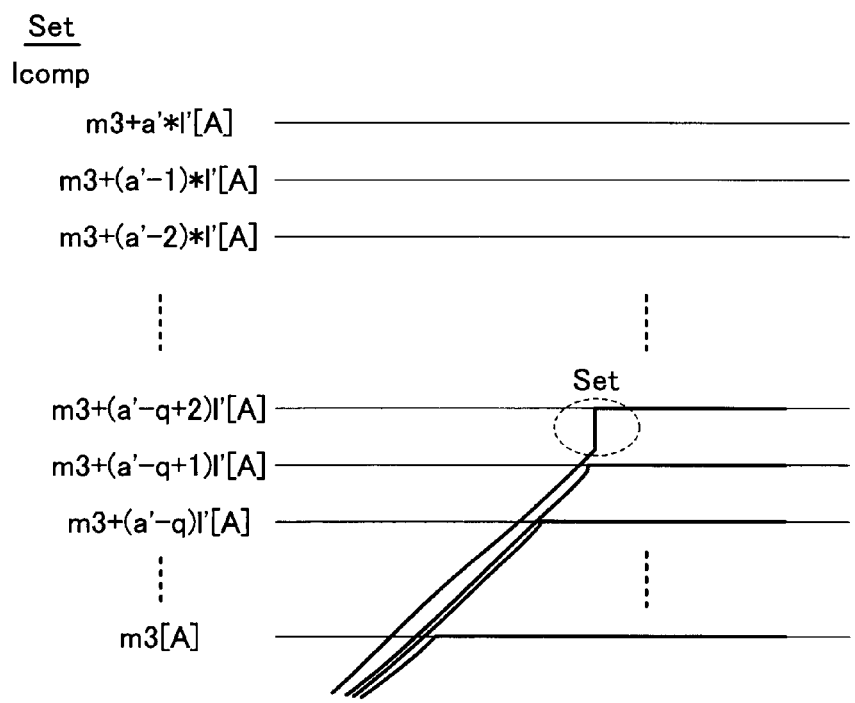
FIG. 10 explains a setting operation according to a second embodiment of the present invention.

Also in a setting operation, as shown in FIG. 10, the initial value of the upper limit Icomp of the reference current Iref is set to a value m3 lower than the lowest current value at which a setting operation can be effected. This stabilizes the characteristic of the variable resistor of the memory cell and can make unevenness of the characteristic among the memory cells smaller.

Though the embodiments of the invention having been explained, the present invention is not limited to these embodiments, but various modifications, addition, etc. can be made thereonto within the scope of the spirit of the invention. For example, the foregoing embodiments employ the configuration of limiting the upper limit of the current flowing through the bit line BL by means of the current mirror circuit 2b in the column control circuit 2. However, the present invention is not limited to this, but a current limiting circuit may be provided separately from the column control circuit.

Furthermore, a current limiting circuit may be provided for the word line WL not for the bit line BL.

What is claimed is:

1. A nonvolatile semiconductor memory device, comprising:
   a memory cell array configured as an arrangement of memory cells each arranged between a first line and a second line and each including a variable resistor;
   a control circuit configured to control a voltage applied to the first line or the second line; and
   a current limiting circuit configured to limit a current flowing through the first line or the second line to a certain upper limit or lower,
   the current limiting circuit being configured to, in a case where a writing operation or an erasing operation to the memory cell is implemented a plural number of times repeatedly, set the upper limit in the writing operation or erasing operation of a p-th time higher than the upper limit in the writing operation or erasing operation of a q-th time (q<p).

2. The nonvolatile semiconductor memory device according to claim 1, wherein the control circuit implements a plurality of pulse applying operations for a writing operation or an erasing operation while setting the upper limit at one value.

3. The nonvolatile semiconductor memory device according to claim 2, wherein in a case where the writing operation or erasing operation is not completed even after the plurality of pulse applying operations for the writing operation or erasing operation while setting the upper limit at one value are completed, the control circuit instructs the current limiting circuit to raise the upper limit.

4. The nonvolatile semiconductor memory device according to claim 2, wherein the upper limit in the writing operation or erasing operation of a first time is set to a value lower than a lowest current value at which writing or erasing to the memory cell can be effected.

5. The nonvolatile semiconductor memory device according to claim 4, wherein in a case where the writing operation or erasing operation is not completed even after the plurality of pulse applying operations for the writing operation or erasing operation while setting the upper limit at one value are completed, the control circuit instructs the current limiting circuit to raise the upper limit.

6. The nonvolatile semiconductor memory device according to claim 1, wherein the upper limit in the writing operation or erasing operation of a first time is set to a value lower than a lowest current value at which writing or erasing to the memory cell can be effected.

7. The nonvolatile semiconductor memory device according to claim 1, further comprising a sense amplifier circuit configured to sense a change of the current flowing through the first line or the second line,
   wherein the current limiting circuit is a current mirror circuit configured to supply a reference current to an input terminal of the sense amplifier circuit in a reading operation to the memory cell.

8. The nonvolatile semiconductor memory device according to claim 7, wherein the control circuit implements a plurality of pulse applying operations for a writing operation or an erasing operation while setting the upper limit at one value.

9. The nonvolatile semiconductor memory device according to claim 8, wherein the upper limit in the writing operation or erasing operation of a first time is set to a value lower than a lowest current value at which writing or erasing to the memory cell can be effected.

10. The nonvolatile semiconductor memory device according to claim 7, wherein the sense amplifier circuit detects a difference between a voltage of a detection line and a reference voltage generated by a reference voltage generating circuit, wherein the voltage of the detection line changes based on a difference between the current flowing through the first line or the second line and the reference current.

11. A method of implementing writing/erasing to a nonvolatile semiconductor memory device including a memory cell array configured as an arrangement of memory cells each arranged between a first line and a second line and each including a variable resistor, the method comprising:
   controlling a voltage applied to the first line or the second line; and
   limiting a current flowing through the first line or the second line to a certain upper limit or lower,
   in limiting the current to the certain upper limit or lower, in a case where a writing operation or an erasing operation to the memory cell is implemented a plural number of times repeatedly, the upper limit in the writing operation or erasing operation of a p-th time is set higher than the upper limit in the writing operation or erasing operation of a q-th time (q<p).

12. The method of implementing writing/erasing to the nonvolatile semiconductor memory device according to claim 11, wherein a voltage to the first line or the second line is controlled such that plural pulse applying operations for a writing operation or an erasing operation while setting the upper limit at one value is implemented.

13. The method of implementing writing/erasing to the nonvolatile semiconductor memory device according to claim 12, further comprising instructing a raise of the upper limit in a case where the writing operation or erasing operation is not completed even after the plural pulse applying operations for the writing operation or erasing operation while setting the upper limit at one value is completed.

14. The method of implementing writing/erasing to the nonvolatile semiconductor memory device according to claim 12, wherein the upper limit in the writing operation or erasing operation of a first time is set to a value lower than a lowest current value at which writing or erasing to the memory cell can be effected.

15. The method of implementing writing/erasing to the nonvolatile semiconductor memory device according to claim 14, further comprising instructing a raise of the upper limit in a case where the writing operation or erasing operation is not completed even after the plural pulse applying operations for the writing operation or erasing operation while setting the upper limit at one value is completed.

16. The method of implementing writing/erasing to the nonvolatile semiconductor memory device according to claim 11, wherein the upper limit in the writing operation or erasing operation of a first time is set to a value lower than a lowest current value at which writing or erasing to the memory cell can be effected.

* * * * *